United States Patent
Zhu et al.

(10) Patent No.: US 11,712,766 B2
(45) Date of Patent: Aug. 1, 2023

(54) METHOD OF FABRICATING A MICROSCALE CANOPY WICK STRUCTURE HAVING ENHANCED CAPILLARY PRESSURE AND PERMEABILITY

(71) Applicant: Toyota Motor Engineering and Manufacturing North America, Inc., Plano, TX (US)

(72) Inventors: Gaohua Zhu, Ann Arbor, MI (US); Evan Fleming, Ann Arbor, MI (US); Kimihiro Tsuchiya, Ann Arbor, MI (US)

(73) Assignee: Toyota Motor Engineering and Manufacturing North America, Inc., Plano, TX (US)

(*) Notice: Subject to any disclaimer, the term of this patent is extended or adjusted under 35 U.S.C. 154(b) by 486 days.

(21) Appl. No.: 16/886,161

(22) Filed: May 28, 2020

(65) Prior Publication Data
US 2021/0370449 A1 Dec. 2, 2021

(51) Int. Cl.
*B23P 15/26* (2006.01)
*F28D 15/04* (2006.01)
*F28D 15/02* (2006.01)
*B81C 1/00* (2006.01)

(52) U.S. Cl.
CPC ......... *B23P 15/26* (2013.01); *B81C 1/00119* (2013.01); *B81C 1/00396* (2013.01); *B81C 1/00523* (2013.01); *F28D 15/0233* (2013.01); *F28D 15/046* (2013.01); *B81B 2201/058* (2013.01); *B81C 2201/0135* (2013.01)

(58) Field of Classification Search
CPC ............ B81C 1/00055; B81C 1/00063; B81C 1/00074; B81C 1/00079; B81C 1/00103; B81C 1/00111; B81C 1/00119; B81C 1/00388; B81C 1/00571; B81C 1/00603; B81C 1/00626; B81C 2201/0135; Y10T 29/49353; B23P 2700/09; B23P 2700/10; B23P 15/26; B81B 2201/058
See application file for complete search history.

(56) References Cited

U.S. PATENT DOCUMENTS

| | | | | |
|---|---|---|---|---|
| 4,004,441 A | | 1/1977 | Leszak | |
| 4,533,430 A | * | 8/1985 | Bower | ................ H01L 21/3065 257/E21.549 |
| 4,615,746 A | * | 10/1986 | Kawakita | .......... H01L 21/76264 257/E21.135 |
| 4,961,821 A | * | 10/1990 | Drake | ............... H01L 21/76898 257/E21.597 |
| 5,156,988 A | * | 10/1992 | Mori | ..................... H01J 21/105 438/42 |
| 5,198,390 A | * | 3/1993 | MacDonald | ......... H01H 1/0036 216/2 |

(Continued)

*Primary Examiner* — Jason L Vaughan
(74) *Attorney, Agent, or Firm* — Jordan IP Law, LLC

(57) ABSTRACT

One or more methods of fabricating a microscale canopy wick structure having an array of individual wicks having one or more canopy members. Each method includes selectively etching a substrate to control the thickness of the canopy members and also control the width of a fluid flow channel between adjacent wicks in a manner that enhances the overall performance of the microscale canopy wick structure.

20 Claims, 11 Drawing Sheets
(4 of 11 Drawing Sheet(s) Filed in Color)

(56) References Cited

U.S. PATENT DOCUMENTS

| | | | | |
|---|---|---|---|---|
| 5,426,070 | A * | 6/1995 | Shaw | G01P 15/0802 216/2 |
| 5,427,975 | A * | 6/1995 | Sparks | G01P 15/0802 216/2 |
| 5,847,454 | A * | 12/1998 | Shaw | B81C 1/0015 257/734 |
| 5,851,928 | A * | 12/1998 | Cripe | H01L 21/3081 257/E21.232 |
| 5,902,165 | A * | 5/1999 | Levine | H01J 9/025 445/24 |
| 6,004,832 | A * | 12/1999 | Haller | B06B 1/0292 216/2 |
| 6,056,044 | A | 5/2000 | Benson et al. | |
| 6,180,536 | B1 * | 1/2001 | Chong | B81C 1/00587 438/712 |
| 6,602,791 | B2 * | 8/2003 | Ouellet | B01L 3/502707 438/720 |
| 6,629,756 | B2 * | 10/2003 | Wang | B41J 2/1646 347/68 |
| 6,645,432 | B1 | 11/2003 | Anderson | B01L 3/0262 137/833 |
| 6,784,076 | B2 * | 8/2004 | Gonzalez | H01L 21/76289 257/E21.654 |
| 6,825,127 | B2 * | 11/2004 | Ouellet | B81C 1/00119 438/700 |
| 6,827,869 | B2 * | 12/2004 | Podlesnik | H01L 21/3065 216/2 |
| 7,045,468 | B2 * | 5/2006 | Liang | H01L 21/76264 257/E21.549 |
| 7,166,488 | B2 * | 1/2007 | MacDonald | C23F 4/00 438/52 |
| 7,538,032 | B2 * | 5/2009 | Borwick | H01L 21/76898 438/667 |
| 7,786,014 | B2 * | 8/2010 | Neuilly | H01L 21/76898 438/700 |
| 7,973,388 | B2 * | 7/2011 | Lee | B81C 1/00626 438/386 |
| 8,159,050 | B2 * | 4/2012 | Fucsko | H01L 21/31116 438/746 |
| 8,664,742 | B2 * | 3/2014 | Wells | H01L 21/3065 257/E29.02 |
| 8,692,339 | B2 * | 4/2014 | Reinmuth | H04R 31/00 438/719 |
| 8,926,848 | B2 * | 1/2015 | Ikarashi | H01L 21/308 347/61 |
| 9,711,392 | B2 * | 7/2017 | Dehe | H01L 21/31058 |
| 9,731,964 | B2 * | 8/2017 | Gandelhman | B81C 1/00619 |
| 10,197,973 | B2 * | 2/2019 | Gandelhman | G04B 19/12 |
| 10,495,387 | B2 | 12/2019 | Zhou et al. | |
| 10,724,804 | B2 * | 7/2020 | Lewis | F28D 15/046 |
| 2009/0041986 | A1 * | 2/2009 | Zhang | B81C 1/00103 264/300 |
| 2019/0333773 | A1 | 10/2019 | Feng et al. | |

* cited by examiner

METHOD OF FABRICATING A MICROSCALE CANOPY WICK STRUCTURE HAVING ENHANCED CAPILLARY PRESSURE AND PERMEABILITY

TECHNICAL FIELD

Embodiments relate generally to one or more methods of fabricating a microscale canopy wick structure for a heat transfer device that is configured to passively control the movement, retention, and coverage of a working liquid to enhance the overall performance of the microscale canopy wick structure.

BACKGROUND

Heat pipes are a general class of passive two-phase (liquid/vapor) heat transfer devices used in thermal management for a wide variety of applications and industries. While there are many types of heat pipes, all traditional heat pipes rely on passive liquid transport by capillary action that is generated by a porous wick material. The wick is the single most important component of a heat pipe in terms of heat pipe performance.

A disadvantage in the state of the art wick structure lies in the nature that capillary pressure and viscous resistance (permeability) are coupled: by reducing the size of the surface surfaces, the capillary pressure increases, but liquid transport is also inhibited due to the significant viscous resistance associated with the small spacings.

Ultrathin membraned supported by wide flow channels are reported to be the best structure so far for evaporation heat transfer. In such configuration, the membrane pore size defines the capillary pressure and membrane thickness dictate the viscous resistance, meanwhile the liquid is supplied to the evaporation surface through the underlying, which are sufficiently wide provide good permeability for the fluid flow. It takes a complicated process, however, to fabricate supported membrane structure, which makes it not suitable for practical application.

The closest prior art to the disclosed invention is thermosiphon, which is a process used to exchange heat based on natural convection, and which circulates a working fluid without the necessity of a mechanical pump. A thermosiphon, however, lacks internal wicks, and relies on gravity to return the liquid back to the heating area.

BRIEF SUMMARY

In thin film evaporation (e.g., two phase cooling) heat transfer, the maximum heat flux (for cooling) that a wick structure can handle is reached when the wick structure/surface is dried out. Thereafter, the surface temperature will increase rapidly (if used for cooling, after dryout, the device will be overheated and burn).

Therefore, the better permeability of each wick means the wick structure has better capability to provide greater coverage across its surface to enhance the cooling and/or lubrication properties thereof.

The present disclosure overcomes the aforementioned obstacles by providing a method of fabricating a microscale canopy wick structure for a heat transfer device. In accordance with embodiments, the wick structure is fabricated in a manner which decouples capillary pressure and permeability, thereby facilitating an efficient flow of the working liquid.

In an embodiment, a method of fabricating a microscale canopy wick structure having an array of individual wicks that respectively comprise a wick body having one or more canopy members that extend at a plane that is perpendicular to the plane from which the wick body extends, the method to comprise one or more of the following: forming a first oxide layer over a substrate; forming a photomask pattern in a photoresist material over the substrate, the photomask pattern corresponding to a predetermined design of the microscale canopy wick structure; selectively etching the first oxide layer, using the photomask pattern as a mask; controlling the width of a capillary pressure region between canopy members of adjacent wicks by selectively etching the substrate, via an isotropic etching process using the patterned first oxide layer and the photomask pattern as masks, to reach a target capillary pressure region width; forming a second oxide layer, as a protective layer, over the substrate; controlling the wick height of the adjacent wicks by selectively etching the substrate, via an isotropic etching process using the patterned first oxide layer and the second oxide layer as masks, to reach a target wick height; and controlling the width of a fluid flow channel between adjacent wicks by selectively etching the substrate, via an anisotropic etching process using the patterned first oxide layer and the second oxide layer as masks, to reach a target fluid flow channel width.

In an embodiment, a method of fabricating a microscale canopy wick structure having an array of individual wicks that respectively comprise a wick body having one or more canopy members, the method to comprise one or more of the following: selectively etching a substrate to reach a target canopy member thickness; and selectively etching the substrate to reach a target width of a fluid flow channel between adjacent wicks.

In an embodiment, a method of fabricating a microscale canopy wick structure having an array of individual wicks that respectively comprise a wick body having one or more canopy members, the method to comprise one or more of the following: controlling the width of a capillary pressure region between canopy members of adjacent wicks by selectively etching a substrate, via an isotropic etching process, to reach a first target width; and controlling the width of a fluid flow channel between adjacent wicks by selectively etching the substrate, via an anisotropic etching process, to reach a second target width that is greater than the first target width.

In an embodiment, a method of fabricating a microscale canopy wick structure having an array of individual wicks that respectively comprise a wick body having one or more canopy members, the method to comprise one or more of the following: controlling, in sequence, the thickness of the canopy members and the width of a fluid flow channel between adjacent wicks, by selectively etching a substrate to reach a target canopy member thickness and a target fluid flow channel width.

In accordance with embodiments, a capillary pressure of the microscale canopy wick structure is a function of the canopy thickness and the width of the capillary pressure region. A permeability of the microscale canopy wick structure is a function of the width of the fluid flow channel between adjacent wicks. The narrower the distance between the canopy members of adjacent wicks, the greater the capillary pressure. The wider the fluid flow channel between adjacent wicks, the greater the permeability.

BRIEF DESCRIPTION OF THE SEVERAL VIEWS OF THE DRAWINGS

The patent or application file contains at least one drawing executed in color. Copies of this patent or patent application publication with color drawing(s) will be provided by the Office upon request and payment of the necessary fee.

The various advantages of the embodiments of the present invention will become apparent to one skilled in the art by reading the following specification and appended claims, and by referencing the following drawings, in which:

DETAILED DESCRIPTION

Figure 1A:
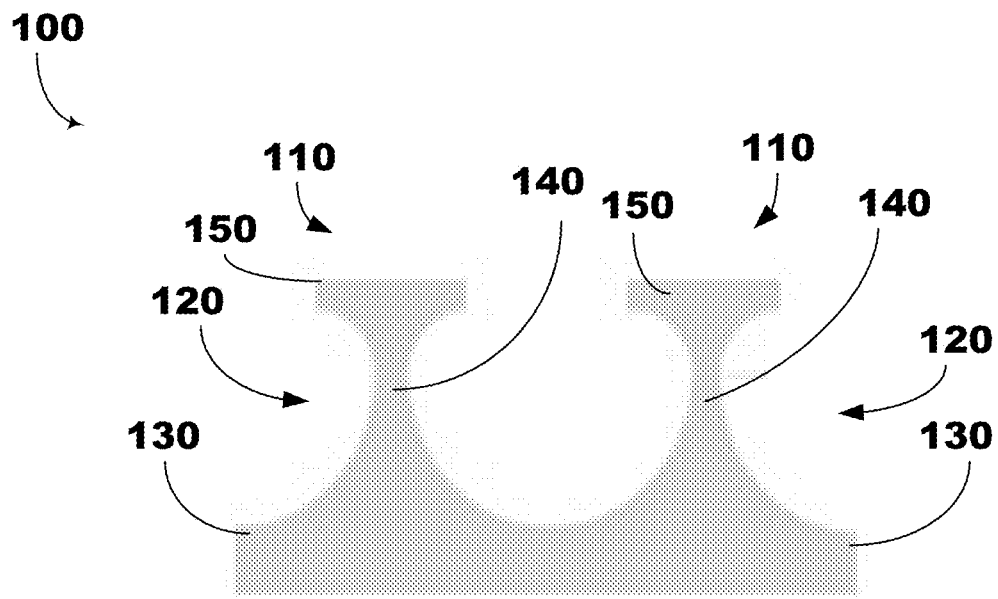
FIGS. 1A and 1B illustrate a cross-sectional view of an example of a microscale canopy wick structure for a heat transfer device, in accordance with embodiments.
Figure 1B:
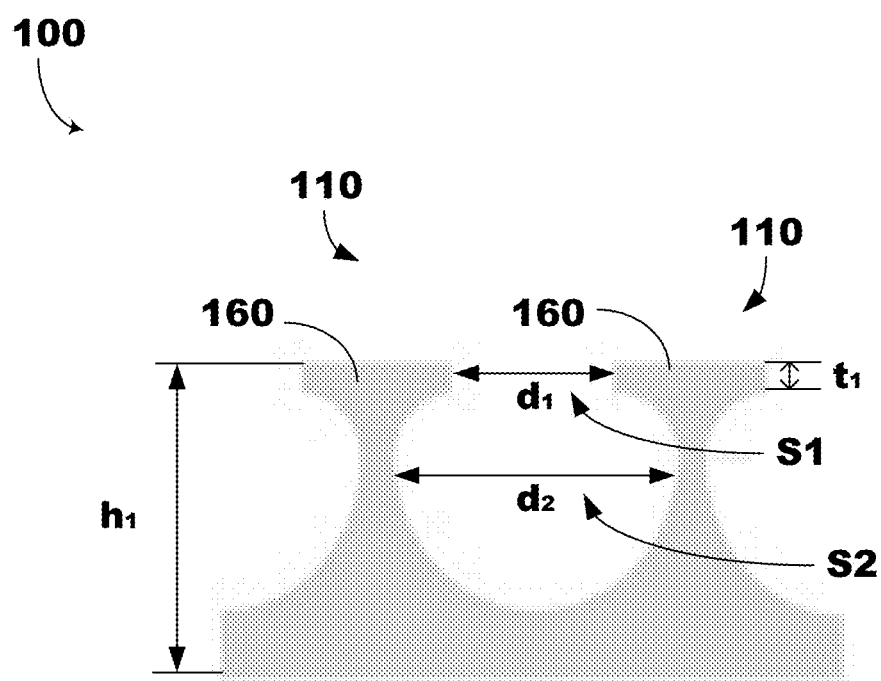

As illustrated in FIG. 1, a microscale canopy wick structure 100 for a heat transfer device/cooling device, such as, for example, a heat pipe. Although the illustrated microscale canopy wick structure 100 may be implemented in a heat transfer device such as a heat pipe, embodiments are not limited therewith. For example, the microscale canopy wick structure 100 may also be implemented as a lubrication device in objects that traditionally require lubrication from a working fluid (e.g., oil) and whereby friction is to be reduced and/or heat is to be dispersed.

In an embodiment, the microscale canopy wick structure 100 comprises an array of individual canopy wicks 110 arranged spaced apart from each other. Each individual canopy wick 110 comprises a longitudinally-extending wick body 120 having a height $h_1$. The wick body 120 comprises a base region 130, an intermediate region 140, and an apex or canopy region 150. The canopy region 150 has a canopy-type cross-section that may include one or more canopy members 160, i.e., overhanging projections having a thickness $t_1$. Although the canopy region 150 has a geometric cross-section that is generally circular, embodiments are not limited thereto. The canopy members 160 may have any geometric cross-section that falls within the spirit and scope of the principles of this disclosure set forth herein.

The canopy members 160 are configured to extend from the wick body 120 at a plane (e.g., horizontal) that is substantially perpendicular to the plane (e.g., vertical) from which the wick body 120 extends. Embodiments, however, are not limited thereto, and thus, the canopy members 160 may extend at an angle relative to the wick body 120 that falls within the spirit and scope of the principles of this disclosure set forth herein.

Canopy members 160 between adjacent or neighboring wicks 110 define a first space S1 at a capillary pressure region of the wick structure 100 which is configured to generate enhanced capillary pressure during operation of the wick structure 100. The intermediate regions 140 between adjacent or neighboring wicks 110 define a second space S2 at a fluid flow channel region of the wick structure 100. The second space S2 forms at least a portion of a fluid flow channel that facilitates enhanced permeability for flow of the working fluid during operation of the wick structure 100.

The first space S1 comprises a first predetermined distance $d_1$, and the second space S2 comprises a second predetermined distance $d_2$. The second predetermined distance $d_2$ is greater than the first predetermined distance $d_1$. The capillary pressure/force of the wick structure is a function of the first predetermined distance $d_1$ whereas the permeability of the wick structure is a function of the second predetermined distance $d_2$.

In accordance with embodiments, the chemical composition of the wick structure 100 may comprise a thermally conductive material, such as, for example, silicon. Embodiments, however, are not limited thereto, and thus, the wick structure 100 may be composed of other thermally conductive materials that fall within the spirit and scope of the principles of this disclosure set forth herein.

FIGS. 2A to 2L illustrate a method 200 of fabricating a wick structure, in accordance with embodiments.

Figure 2A:
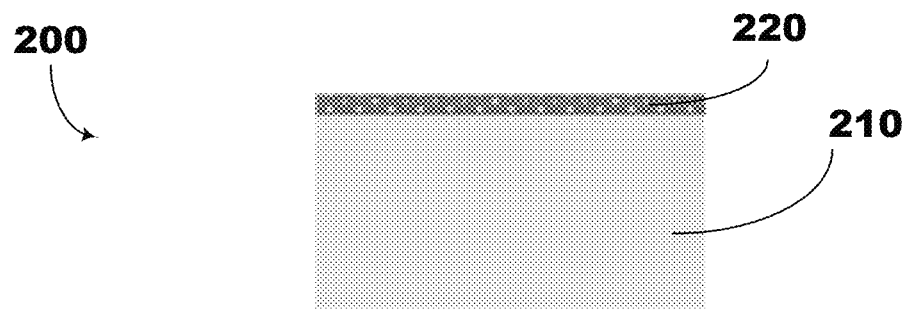
FIGS. 2A to 2L schematically illustrate a method of fabricating a wick structure, in accordance with embodiments.

As illustrated in FIG. 2A, a first oxide layer 220 is formed or applied on and/or over an exposed surface of a wafer or substrate 210. The substrate 210 may be composed of a thermally conductive material such as silicon, and the first oxide layer 220 may comprise silicon dioxide ($SiO_2$). In accordance with embodiments, the first oxide layer 220 may be formed using a deposition technique, such as, any one of chemical vapor deposition (CVD), thermal oxidation, spin-on film, physical vapor deposition (PVD), or electrodeposition. Embodiments, however, are not limited thereto, and thus, any deposition technique that falls within the spirit and scope of the principles of this disclosure set forth herein may be used.

Figure 2B:
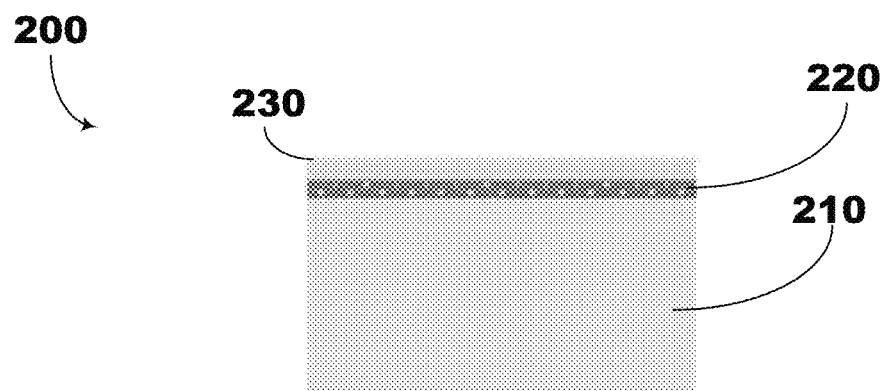

As illustrated in FIG. 2B, a photoresist material 230 is formed or applied on and/or over the substrate 210. In the illustrated embodiment, the photoresist material 230 may be composed of a polymer material. Such a polymer material may comprise an organic polymer material. The photoresist material 230 may be formed or applied over the substrate 210 using a coating method such as spin coating, spray coating, deep coating, etc.

Figure 2C:
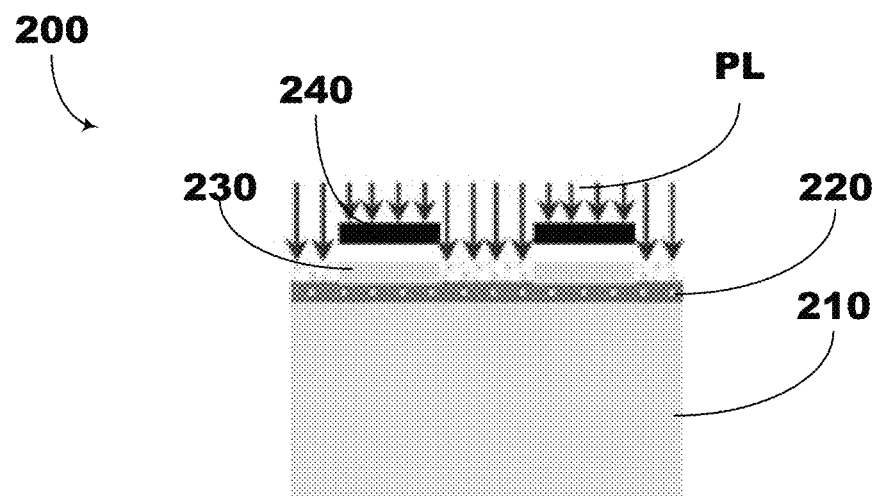
Figure 2D:
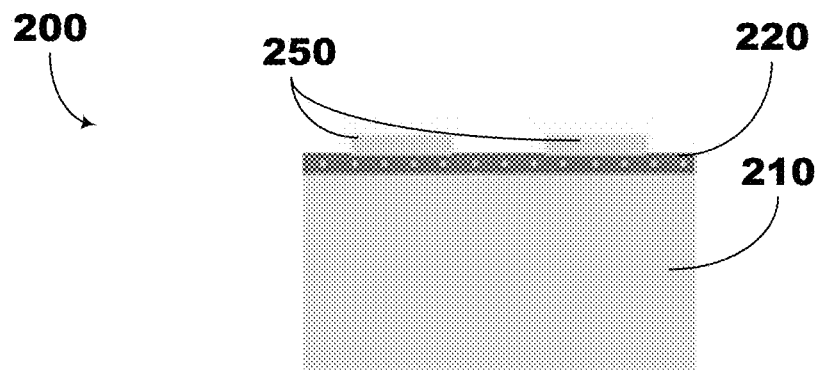

As illustrated in FIGS. 2C and 2D, a photomask pattern 240, corresponding to the desired or predetermined of the wick structure to be replicated onto the substrate 210, is formed on and/or over the substrate 210. Using a photolithographic process, exposed regions of the photoresist material 230 are developed, for example, using a solution that selectively dissolves the exposed regions of the photoresist material 230 to thereby form a material pattern 250 in the photoresist material 230 that corresponds to the photomask pattern 240. The photoresist material 230 may then be selectively etched to form the desired or predetermined design of the wick structure.

Figure 2E:
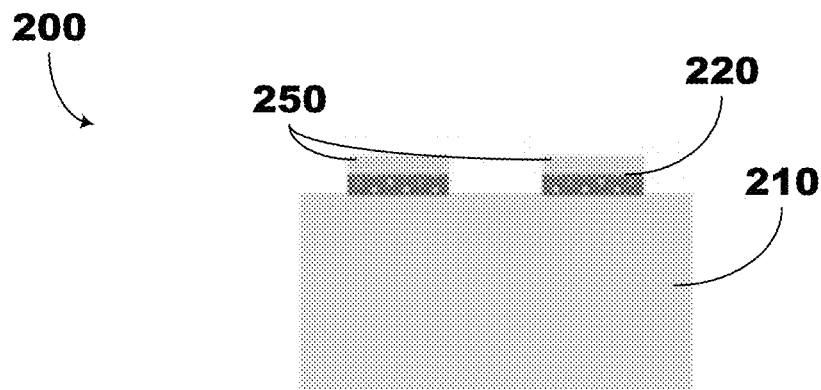

As illustrated in FIG. 2E, using the material pattern 250 of the photoresist material 230 as a mask, exposed regions of the first oxide layer 220 are then selectively etched.

Figure 2F:
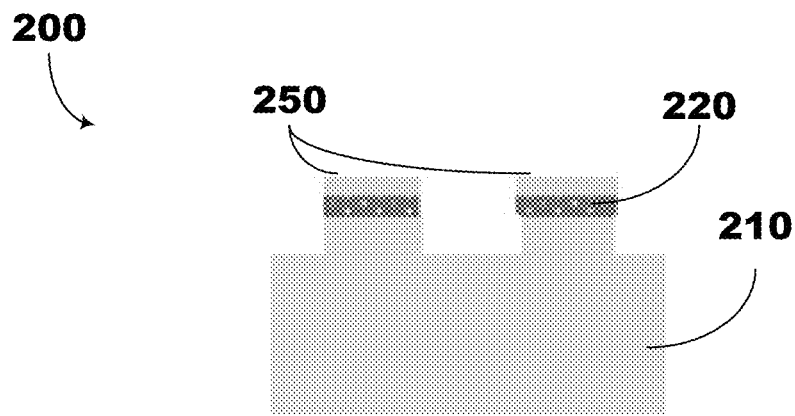

As illustrated in FIG. 2F, using the patterned first oxide layer 220 and photoresist material 230 as masks, an etching process may then be conducted to selectively etch exposed regions of the substrate 210 to control the thickness of the capillary pressure region of the wick structure. The selective etching is to reach a predetermined/target/threshold thickness $t_1$. The predetermined/target/threshold thickness $t_1$ is variable depending upon the specific operating requirements for the wick structure. The etching process may comprise a wet etching process such as, for example, isotropic etching.

Figure 2G:
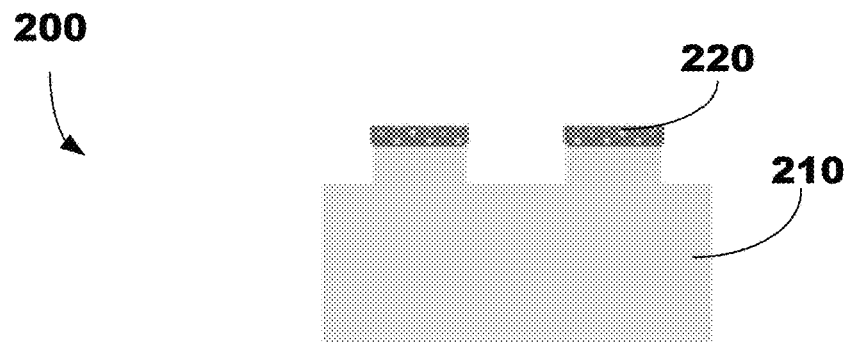

As illustrated in FIG. 2G, the first material pattern 250 of the photoresist material 230 can be removed via etching.

Figure 2H:
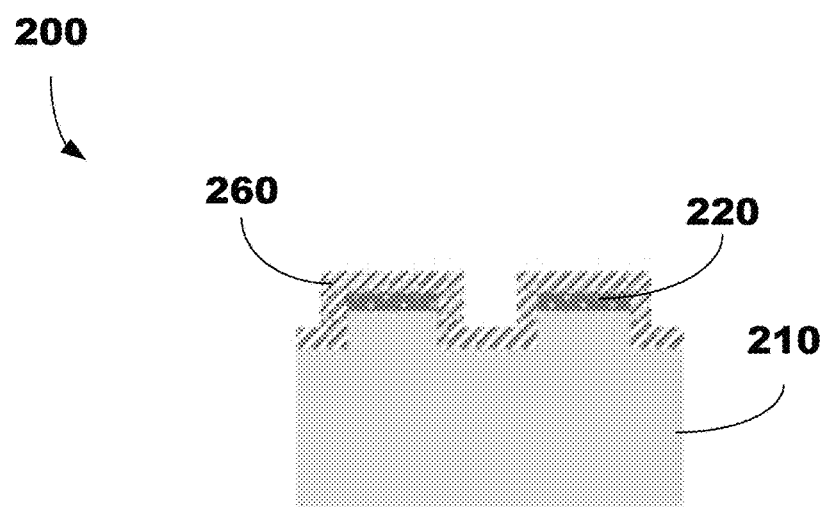

As illustrated in FIG. 2H, a second oxide layer 260, as a protective layer, is formed on and/or over exposed regions of the substrate 210. In an embodiment, the second oxide layer 260 may comprise silicon dioxide ($SiO_2$). The second oxide layer 260 may be formed by conducting a deposition process to reach a target thickness of 2-10 microns.

Figure 2I:
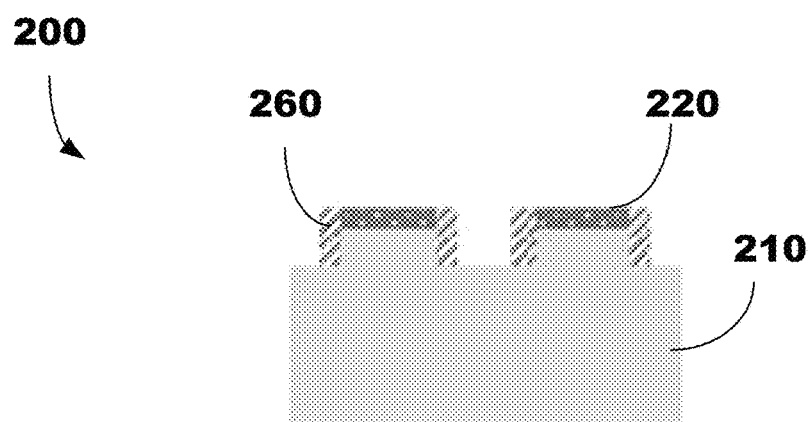

As illustrated in FIG. 2I, the second oxide layer 260 is selectively etched to expose regions of the substrate 210.

Figure 2J:
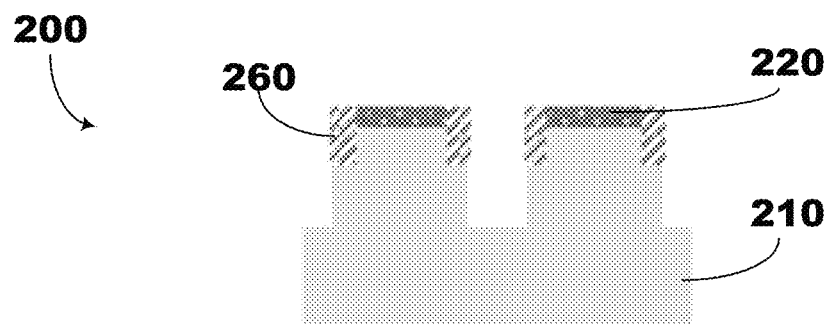

As illustrated in FIG. 2J, the exposed regions of the substrate 210 are selectively etched isotropically to control the height of the wick body. The selective etching is to reach a predetermined/target/threshold height $h_1$. The predetermined/target/threshold height $h_1$ is variable depending upon the specific operating requirements for the wick structure.

Figure 2K:
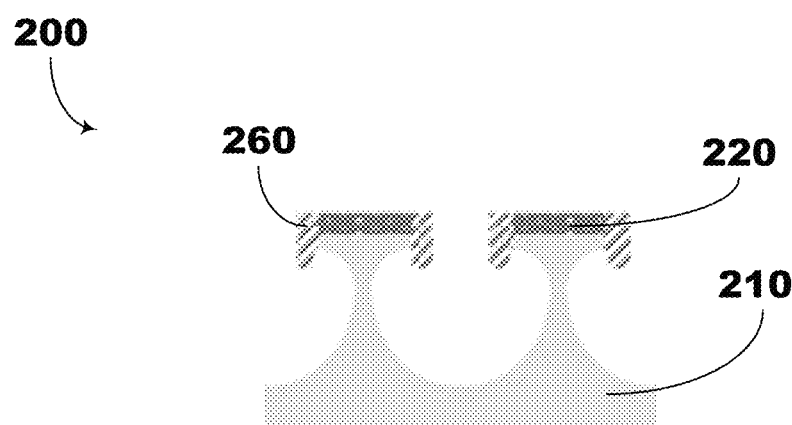

As illustrated in FIG. 2K, to control the width of the fluid flow channel region defined by the space between adjacent wicks, exposed regions of the substrate 210 are selectively etched anisotropically using the patterned first oxide layer and the second oxide layer as masks to obtain a predetermined/target/threshold width that corresponds to the second distance $d_2$. The predetermined/target/threshold width is variable depending upon the specific operating requirements for the wick structure.

Figure 2L:
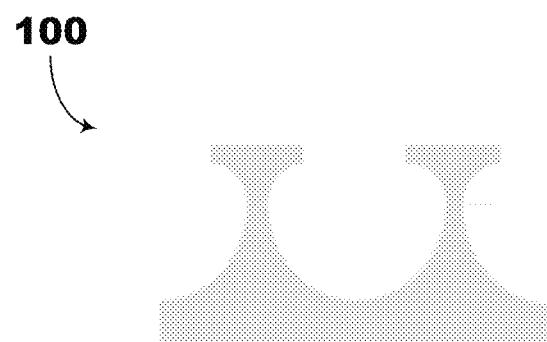

As illustrated in FIG. 2L, the first oxide layer 220 and the second oxide layer 260 are removed by selective etching, thereby exposing the apex regions of the wick structure.

Figure 3:
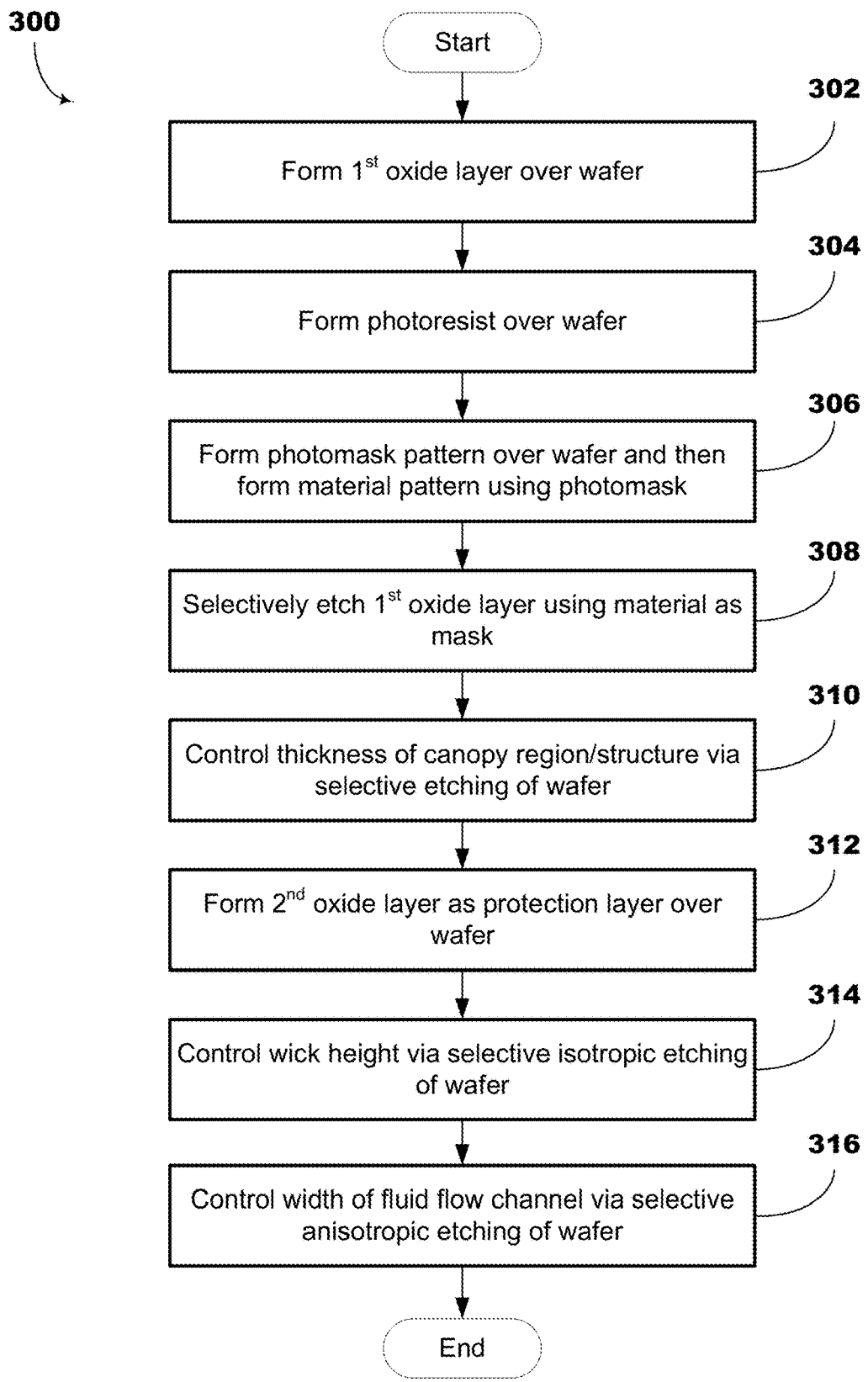
FIG. 3 illustrates a flowchart of a method of fabricating a wick structure, in accordance with embodiments.

FIG. 3 illustrates a flowchart of a method 300 of fabricating a wick structure, in accordance with embodiments. The flowchart of the method 300 corresponds to the schematic illustrations of the method illustrated in FIGS. 2A to 2L and which is set forth and described herein. In accordance with embodiments, the method 300 may be implemented, for example, using logic instructions (e.g., software), configurable logic, fixed-functionality hardware logic, etc., or any combination thereof. As an example, software executed on one or more computer systems may provide functionality described or illustrated herein. In particular, software executing on one or more computer systems may perform one or more fabrication or processing blocks of the method 300, described or illustrated herein or provides functionality described or illustrated herein.

At illustrated processing block 302, a first oxide layer is formed or applied, at a target thickness, on and/or over an exposed surface of a wafer or substrate.

At illustrated processing block 304, a photoresist material is formed or applied on and/or over the substrate.

At illustrated processing block 306, a material pattern, corresponding to the desired or predetermined design of the wick structure to be replicated onto the substrate, is formed in the photoresist material using a photomask pattern as a mask. The photoresist material may then be selectively etched to form the desired or predetermined design of the wick structure.

At illustrated processing block 308, exposed regions of the first oxide layer are selectively etched using the material pattern of the photoresist material as a mask.

At illustrated processing block 310, to control the thickness of the capillary pressure region of each wick, exposed regions of the substrate are selectively etched isotropically using the patterned first oxide layer and the photoresist material as masks. The selective etching is to reach a predetermined/target/threshold thickness $t_1$.

At illustrated processing block 312, a second oxide layer, as a protective layer, is formed on and/or over exposed regions of the substrate.

At illustrated processing block 314, to control the height of the wick body, exposed regions of the substrate are selectively etched isotropically to reach a predetermined/target/threshold height $h_1$.

At illustrated processing block 316, to control the width of the flow channel region defined by the distance between adjacent wicks, exposed regions of the substrate are selectively etched anisotropically to reach a predetermined/target/threshold that corresponds to the second predetermined distance $d_2$.

Figure 4:
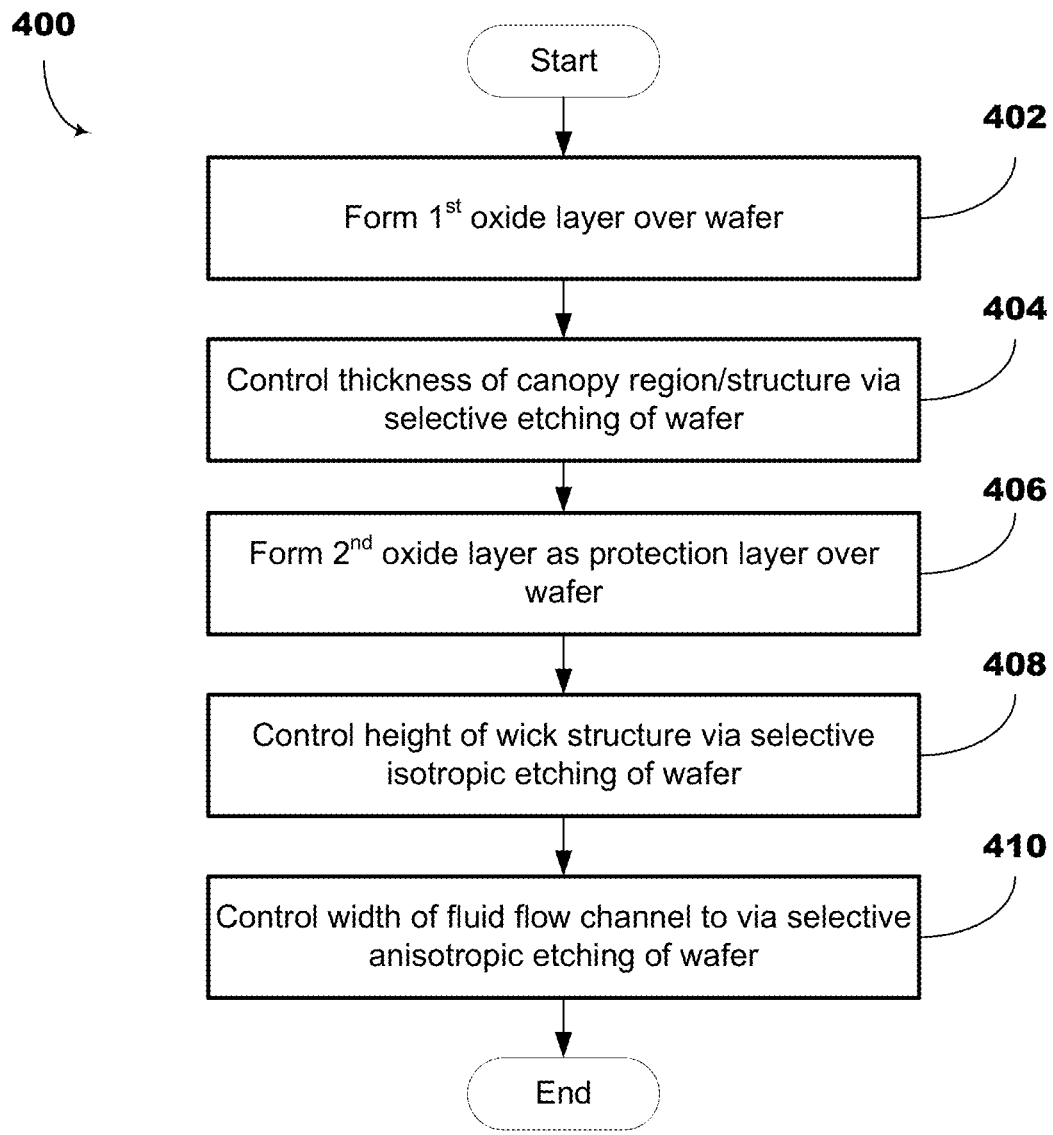
FIGS. 4 to 7 respectively illustrate a flowchart of a method of fabricating a wick structure, in accordance with embodiments.

FIG. 4 illustrates a flowchart of a method 400 of fabricating a wick structure, in accordance with embodiments. The flowchart of the method 400 corresponds to the schematic illustrations of the method illustrated in FIGS. 2A to 2L and which is set forth and described herein. In accordance with embodiments, the method 400 may be implemented, for example, using logic instructions (e.g., software), configurable logic, fixed-functionality hardware logic, etc., or any combination thereof. As an example, software executed on one or more computer systems may provide functionality described or illustrated herein. In particular, software executing on one or more computer systems may perform one or more fabrication or processing blocks of the method 400, described or illustrated herein or provides functionality described or illustrated herein.

At illustrated processing block 402, a first oxide layer is formed or applied, at a target thickness, on and/or over an exposed surface of a wafer or substrate.

At illustrated processing block 404, to control the thickness of the capillary pressure region, exposed regions of the substrate are selectively etched isotropically using the patterned first oxide layer and the photoresist material as masks. The selective etching is to reach a predetermined/target/threshold thickness $t_1$.

At illustrated processing block 406, a second oxide layer, as a protective layer, is formed on and/or over exposed regions of the substrate.

At illustrated processing block 408, to control the height of the wick structure, exposed regions of the substrate are selectively etched isotropically to reach a predetermined/target/threshold height $h_1$.

At illustrated processing block 410, to control the width of the fluid flow channel region defined by the distance between adjacent wicks, exposed regions of the substrate are selectively etched anisotropically to reach a predetermined/target/threshold width that corresponds to the second predetermined distance $d_2$.

Figure 5:
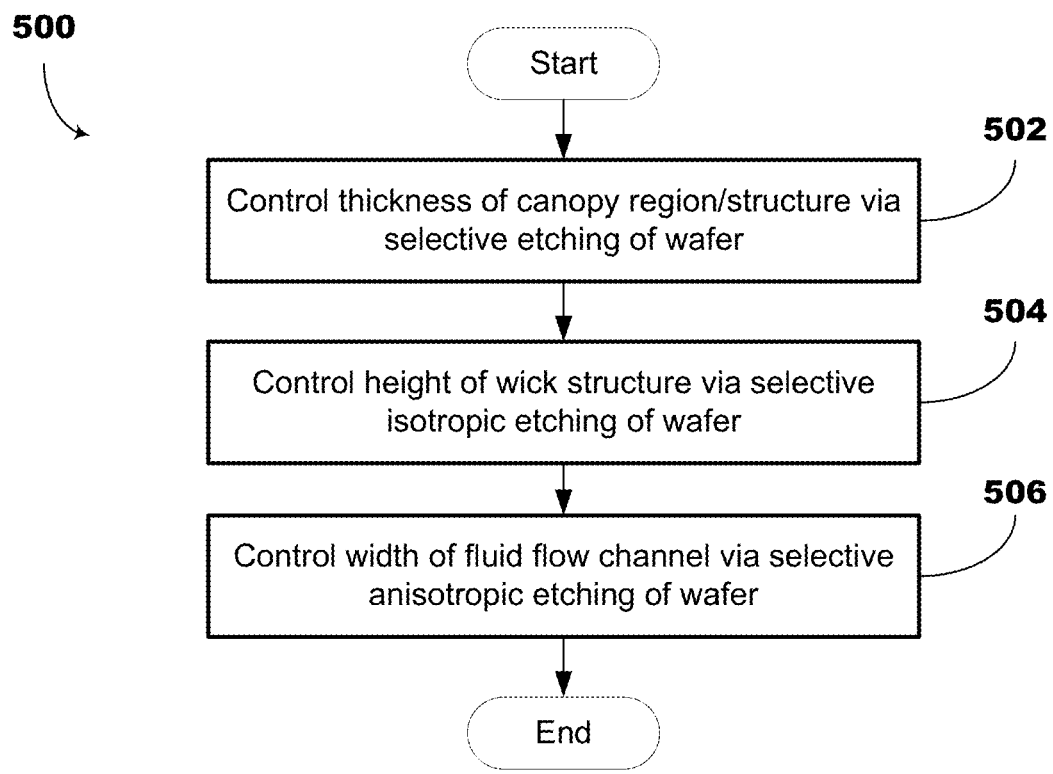

FIG. 5 illustrates a flowchart of a method 500 of fabricating a wick structure, in accordance with embodiments. The flowchart of the method 500 corresponds to the schematic illustrations of the method illustrated in FIGS. 2A to 2L and which is set forth and described herein. In accordance with embodiments, the method 500 may be implemented, for example, using logic instructions (e.g., software), configurable logic, fixed-functionality hardware logic, etc., or any combination thereof. As an example, software executed on one or more computer systems may provide functionality described or illustrated herein. In particular, software executing on one or more computer systems may perform one or more fabrication or processing blocks of the method 500, described or illustrated herein or provides functionality described or illustrated herein.

At illustrated processing block 502, to control the thickness of the capillary pressure region of the wick structure, exposed regions of the substrate are selectively etched isotropically using the patterned first oxide layer and the photoresist material as masks. The selective etching is to reach a predetermined/target/threshold thickness $t_1$.

At illustrated processing block 504, to control the height of the wick structure, exposed regions of the substrate are selectively etched isotropically to reach a predetermined/target/threshold wick height $h_1$.

At illustrated processing block 506, to control the width of the fluid flow channel region defined by the distance between adjacent wicks, exposed regions of the substrate are selectively etched anisotropically to reach a predetermined/target/threshold width that corresponds to the third predetermined distance $d_2$.

Figure 6:
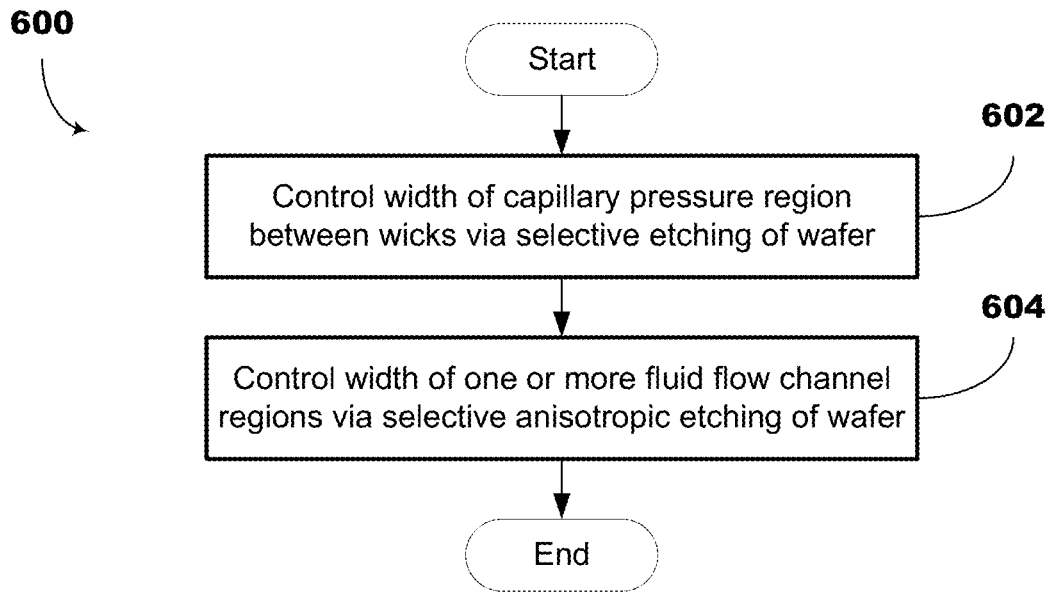

FIG. 6 illustrates a flowchart of a method 600 of fabricating a wick structure, in accordance with embodiments. The flowchart of the method 600 corresponds to the schematic illustrations of the method illustrated in FIGS. 2A to 2L and which is set forth and described herein. In accordance with embodiments, the method 600 may be implemented, for example, using logic instructions (e.g., software), configurable logic, fixed-functionality hardware logic, etc., or any combination thereof. As an example, software executed on one or more computer systems may provide functionality described or illustrated herein. In particular, software executing on one or more computer systems may perform one or more fabrication or processing blocks of the method 600, described or illustrated herein or provides functionality described or illustrated herein.

At illustrated processing block 602, to control the thickness of the capillary pressure region of the wick structure, exposed regions of the substrate are selectively etched isotropically using the patterned first oxide layer and the photoresist material as masks. The selective etching is to reach a predetermined/target/threshold thickness $t_1$.

At illustrated processing block 604, to control the width of a fluid flow channel region defined by the space between adjacent wicks, exposed regions of the substrate are selectively etched isotropically to reach a predetermined/target/threshold width that corresponds to the second predetermined distance $d_2$.

Figure 7:
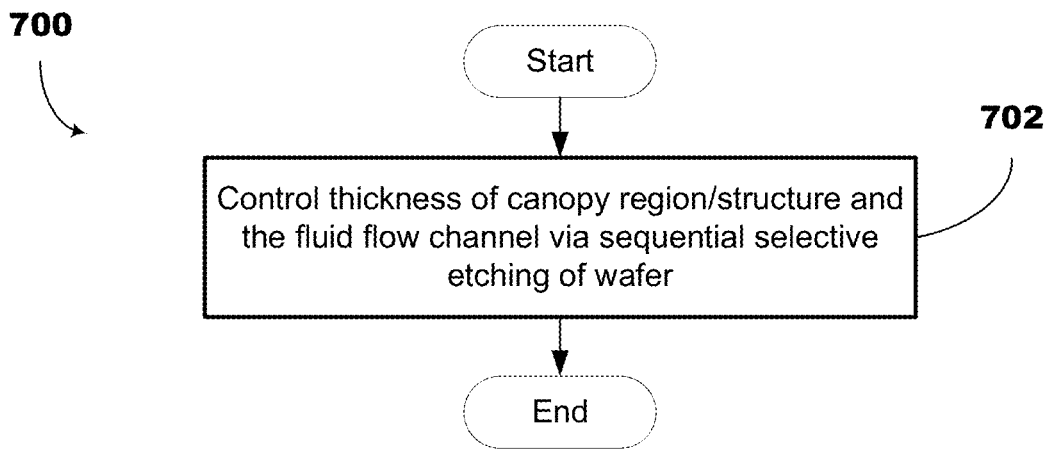

FIG. 7 illustrates a flowchart of a method 700 of fabricating a wick structure, in accordance with embodiments. The flowchart of the method 700 corresponds to one or more of the schematic illustrations of the method illustrated in FIGS. 2A to 2L and which is set forth and described herein. In accordance with embodiments, the method 700 may be implemented, for example, using logic instructions (e.g., software), configurable logic, fixed-functionality hardware logic, etc., or any combination thereof. As an example, software executed on one or more computer systems may provide functionality described or illustrated herein. In particular, software executing on one or more computer systems may perform one or more fabrication or processing blocks of the method 700, described or illustrated herein or provides functionality described or illustrated herein.

At illustrated processing block 702, to control a thickness of a canopy structure of the wick and a width of a fluid flow channel defined by the space between adjacent wicks, a substrate is selectively etched, in sequence, to reach: (i) a target canopy thickness, and (ii) a target fluid flow channel width that corresponds to the second predetermined distance $d_2$.

Figure 8A:
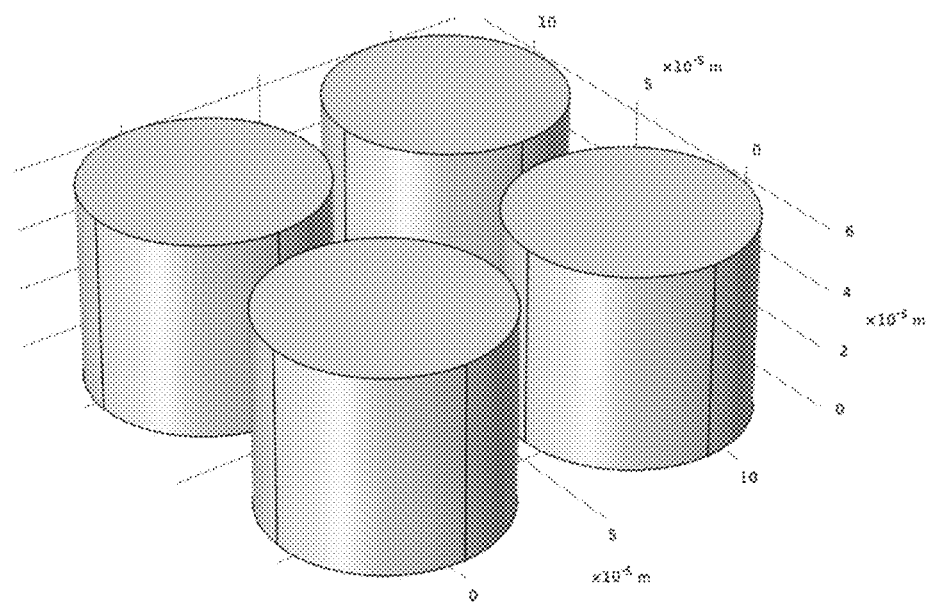
FIGS. 8A and 8B illustrate a permeability profile using a simulation of fluid flow through a micropillar wick structure.
Figure 8B:
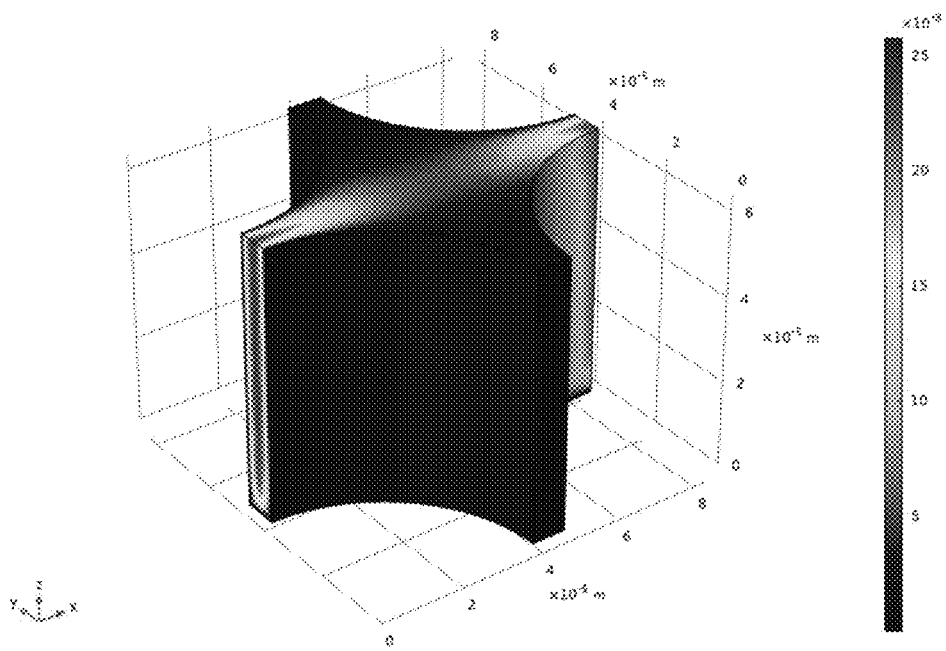

FIG. 8A illustrates a permeability profile, using a simulation of fluid flow (using water as the fluid) through a micropillar wick having the geometry illustrated in FIG. 8B. The pressure drop applied for the micropillar wick is 50 Pa.

As illustrated in FIG. 8A, the micropillar wick has a structural profile in which permeability and capillary pressure are inversely correlated (e.g., an increase in capillary pressure results in a decrease in permeability). This coupling yields a permeability (or liquid flow rate) of 6.0054E-12 [$m^3$/s].

Figure 9A:
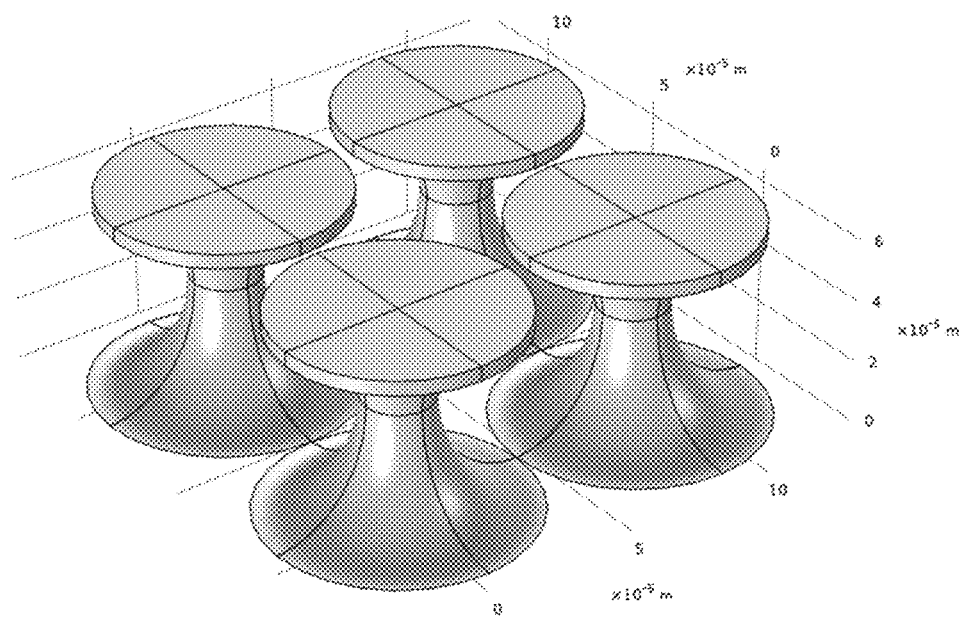
FIGS. 9A and 9B illustrate a permeability profile using a simulation of fluid flow through a canopy wick structure fabricated in accordance with embodiments.
Figure 9B:
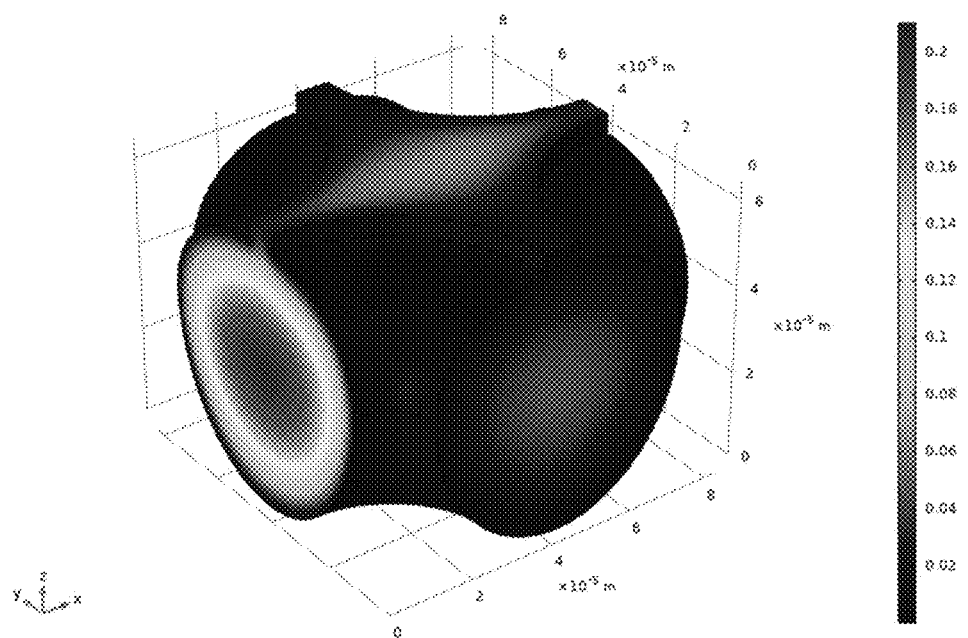

FIG. 9A illustrates a permeability profile, using a simulation of fluid flow (using water as the fluid) through a canopy wick, fabricated in accordance with embodiments, having the geometry illustrated in FIG. 9B. The pressure drop applied for the canopy wick is 50 Pa.

As illustrated in FIG. 9A, by comparison, the canopy wick fabricated in accordance with embodiments has a structural profile in which permeability and capillary pressure are decoupled (e.g., an increase in capillary pressure results in an increase in permeability). This yields a higher permeability of 3.3984E-10 [$m^3$/s]. The canopy wick is capable of providing greater coverage across its surface, to thereby increase its overall cooling and/or lubrication properties. Meaning, fluid flows through the canopy wick structure at a faster rate than that of a micropillar wick lacking a canopy structural profile.

The terms "coupled," "attached," or "connected" may be used herein to refer to any type of relationship, direct or indirect, between the components in question, and may apply to electrical, mechanical, fluid, optical, electromagnetic, electromechanical or other connections. In addition, the terms "first," "second," etc. are used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

What is claimed is:

1. A method of fabricating a microscale canopy wick structure having an array of individual wicks having one or more canopy members, the method comprising:
    forming a first oxide layer over a substrate;
    forming a photomask pattern in a photoresist material over the substrate, the photomask pattern corresponding to a predetermined design of the microscale canopy wick structure;
    selectively etching the first oxide layer, using the photomask pattern as a mask;
    controlling the thickness of the canopy members by selectively etching the substrate, via an isotropic etching process using the patterned first oxide layer and the photomask pattern as masks, to reach a target canopy thickness, wherein at least one of the one or more canopy members is configured to extend from a vertical wick body of one or more of the individual wicks at a plane that is substantially perpendicular to a vertical plane from which the vertical wick body extends, and the at least one of the one or more canopy members have a substantially geometric cross-section;
    forming a second oxide layer, as a protective layer, over the substrate;
    controlling the height of the wicks by selectively etching the substrate, via an isotropic etching process using the patterned first oxide layer and the second oxide layer as masks, to reach a target wick height; and
    controlling the width of a fluid flow channel between adjacent wicks by selectively etching the substrate, via an anisotropic etching process using the patterned first oxide layer and the second oxide layer as masks, to reach a target fluid flow channel width.

2. The method of claim 1, wherein the substrate comprises a thermally conductive material.

3. The method of claim 2, wherein the thermally conductive material comprises a silicon.

4. The method of claim 1, wherein a capillary pressure of the microscale canopy wick structure is a function of the target canopy thickness.

5. The method of claim 1, wherein a permeability of the microscale canopy wick structure is a function of the target fluid flow channel width.

6. The method of claim 1, wherein the method is implemented by one or more computing devices.

7. A method of fabricating a microscale canopy wick structure having an array of individual wicks having one or more canopy members, the method comprising:
controlling the thickness of the canopy members by selectively etching the substrate, via an isotropic etching process using the patterned first oxide layer and the photomask pattern as masks, to reach a target canopy thickness, wherein at least one of the one or more canopy members is configured to extend from a vertical wick body of one or more of the individual wicks at a plane that is substantially perpendicular to a vertical plane from which the vertical wick body extends, and the at least one of the one or more canopy members have a substantially geometric cross-section; and
controlling the width of a fluid flow channel between adjacent wicks by selectively etching the substrate, via an anisotropic etching process, to reach a target fluid flow channel width.

8. The method of claim 7, wherein the substrate comprises a thermally conductive material.

9. The method of claim 8, wherein the thermally conductive material comprises a silicon.

10. The method of claim 7, wherein a capillary pressure of the microscale canopy wick structure is a function of the target canopy thickness.

11. The method of claim 7, wherein a permeability of the microscale canopy wick structure is a function of the target fluid flow channel width.

12. The method of claim 7, wherein the method is implemented by one or more computing devices.

13. A method of fabricating a microscale canopy wick structure having an array of individual wicks having one or more canopy members, the method comprising:
controlling, in sequence, the thickness of the canopy members and the width of a fluid flow channel between adjacent wicks by selectively etching a substrate to reach a target canopy thickness and a target fluid flow channel width, wherein at least one of the one or more canopy members is configured to extend from a vertical wick body of one or more of the individual wicks at a plane that is substantially perpendicular to a vertical plane from which the vertical wick body extends, and the at least one of the one or more canopy members have a substantially geometric cross-section.

14. The method of claim 13, wherein the substrate comprises a thermally conductive material.

15. The method of claim 14, wherein the thermally conductive material comprises a silicon.

16. The method of claim 13, wherein a capillary pressure of the microscale canopy wick structure is a function of the target canopy thickness.

17. The method of claim 13, wherein a permeability of the microscale canopy wick structure is a function of the target fluid flow channel width.

18. The method of claim 13, wherein controlling the thickness of the canopy members comprises selectively etching the substrate via an isotropic etching process.

19. The method of claim 13, wherein controlling the width of the fluid flow channel comprises selectively etching the substrate via an anisotropic etching process.

20. The method of claim 13, wherein the method is implemented by one or more computing devices.

* * * * *